US007708452B2

(12) United States Patent
Maxik et al.

(10) Patent No.: US 7,708,452 B2
(45) Date of Patent: May 4, 2010

(54) LIGHTING APPARATUS INCLUDING FLEXIBLE POWER SUPPLY

(75) Inventors: Fredric S. Maxik, Weston, FL (US); Paul James Garrity, Rockwall, TX (US)

(73) Assignee: Lighting Science Group Corporation, Dallas, TX (US)

( * ) Notice: Subject to any disclaimer, the term of this patent is extended or adjusted under 35 U.S.C. 154(b) by 687 days.

(21) Appl. No.: 11/449,138

(22) Filed: Jun. 8, 2006

(65) Prior Publication Data

US 2007/0296350 A1    Dec. 27, 2007

(51) Int. Cl.
*F21S 9/00* (2006.01)
*H01R 33/94* (2006.01)
*H01R 33/96* (2006.01)

(52) U.S. Cl. ............. 362/650; 362/249.02; 362/249.05; 362/249.12; 174/254

(58) Field of Classification Search ................. 362/650, 362/249, 249.02, 249.05, 249.12; 174/254
See application file for complete search history.

(56) References Cited

U.S. PATENT DOCUMENTS

| 1,064,571 | A | * | 6/1913 | Triquet ................. 313/318.04 |
| 4,211,955 | A | * | 7/1980 | Ray ........................... 315/53 |
| 4,394,707 | A | * | 7/1983 | Consoli ...................... 361/750 |
| 4,727,289 | A | * | 2/1988 | Uchida ......................... 315/71 |
| 5,463,287 | A | * | 10/1995 | Johnson ....................... 315/187 |
| 5,726,535 | A | * | 3/1998 | Yan ......................... 315/185 R |
| 5,806,965 | A | * | 9/1998 | Deese ......................... 362/249 |
| 6,523,978 | B1 | * | 2/2003 | Huang ........................ 362/252 |
| 6,621,222 | B1 | * | 9/2003 | Hong .......................... 315/51 |
| 6,688,753 | B2 | * | 2/2004 | Calon et al. ................. 362/236 |
| 6,697,130 | B2 | | 2/2004 | Weindorf et al. |
| 6,709,132 | B2 | * | 3/2004 | Ishibashi .................... 362/249 |
| 7,086,756 | B2 | * | 8/2006 | Maxik ........................ 362/249 |
| 2005/0086801 | A1 | | 4/2005 | Liu et al. |
| 2006/0006784 | A1 | * | 1/2006 | Takahara et al. ............. 313/490 |
| 2006/0232974 | A1 | * | 10/2006 | Lee et al. .................... 362/294 |

FOREIGN PATENT DOCUMENTS

| DE | 102 01 045 A1 | 9/2002 |
| EP | 1 046 859 A1 | 10/2000 |
| GB | 1 519 150 | 7/1978 |
| JP | 2000-188001 | 7/2000 |
| JP | 2004-207043 | 7/2004 |
| WO | WO 02/17690 A1 | 2/2002 |
| WO | WO 2005/078335 A1 | 8/2005 |

OTHER PUBLICATIONS

PCT Search Report (Forms PCT/ISA/220 and 210) and PCT Written Opinion (Form PCT/ISA/237) mailed by the European Patent Office on Nov. 23, 2007 in PCT Application No. PCT/US2007/069528, 16 pages.

* cited by examiner

*Primary Examiner*—Ismael Negron
(74) *Attorney, Agent, or Firm*—Cantor Colburn LLP

(57) ABSTRACT

A device has an electrical connector, a radiation generator, and a flexible carrier with circuitry that is operatively coupled between the connector and the radiation generator. In response to electrical power received through the connector, the circuitry energizes the radiation generator, and the radiation generator emits radiation. In a different embodiment, a device has an electrical connector, a radiation generator, and a member with circuitry embedded therein. The circuitry is operatively coupled between the connector and the radiation generator. In response to electrical power received through the connector, the circuitry energizes the radiation generator, and the radiation generator emits radiation.

13 Claims, 16 Drawing Sheets

US 7,708,452 B2

LIGHTING APPARATUS INCLUDING FLEXIBLE POWER SUPPLY

FIELD OF THE INVENTION

This invention relates in general to devices that emit electromagnetic radiation and, more particularly, to devices that use light emitting diodes or other semiconductor parts to produce the electromagnetic radiation.

BACKGROUND

Over the past century, a variety of different types of lightbulbs have been developed. The most common type of lightbulb is the incandescent bulb, in which electric current is passed through a metal filament disposed in a vacuum, causing the filament to glow and emit light. Another common type of lightbulb is the fluorescent light.

Recently, bulbs have been developed that produce illumination in a different manner, in particular through the use of light emitting diodes (LEDs). Pre-existing LED lightbulbs have been generally adequate for their intended purposes, but they have not been satisfactory in all respects.

As a first aspect of this, above a temperature of about 25° C., an LED operates less efficiently and produces less light than at lower temperatures. In particular, as the operating temperature progressively increases above 25° C., the light output of the LED progressively decreases. One approach to heat dissipation is to simply provide a heat sink. But although a heat sink can spread the heat, it does not remove the heat effectively from the vicinity of the LEDs, which reduces the brightness of the LEDs and shortens their operational lifetime. Consequently, efficient dissipation of the heat produced by the LEDs is desirable in an LED lightbulb.

A further consideration is that an LED lightbulb typically needs to contain some circuitry that will take standard household electrical power and convert it to a voltage and/or waveform that is suitable to drive one or more LEDs. Consequently, a relevant design consideration is how to package this circuitry within an LED lightbulb.

In this regard, it can be advantageous if the LED lightbulb has the size and shape of a standard lightbulb, including a standard base such as the type of base commonly known as a medium Edison base. However, due to spatial and thermal considerations, existing LED lightbulbs have not attempted to put the circuitry in the Edison base. Instead, the circuitry is placed at a different location, where it alters the size and/or shape of the bulb so that the size and/or shape differs from that of a standard lightbulb. For example, the bulb may have a special cylindrical section that is offset from the base and that contains the circuitry.

BRIEF DESCRIPTION OF THE DRAWINGS

A better understanding of the present invention will be realized from the detailed description that follows, taken in conjunction with the accompanying drawings, in which.

DETAILED DESCRIPTION

Figure 1:
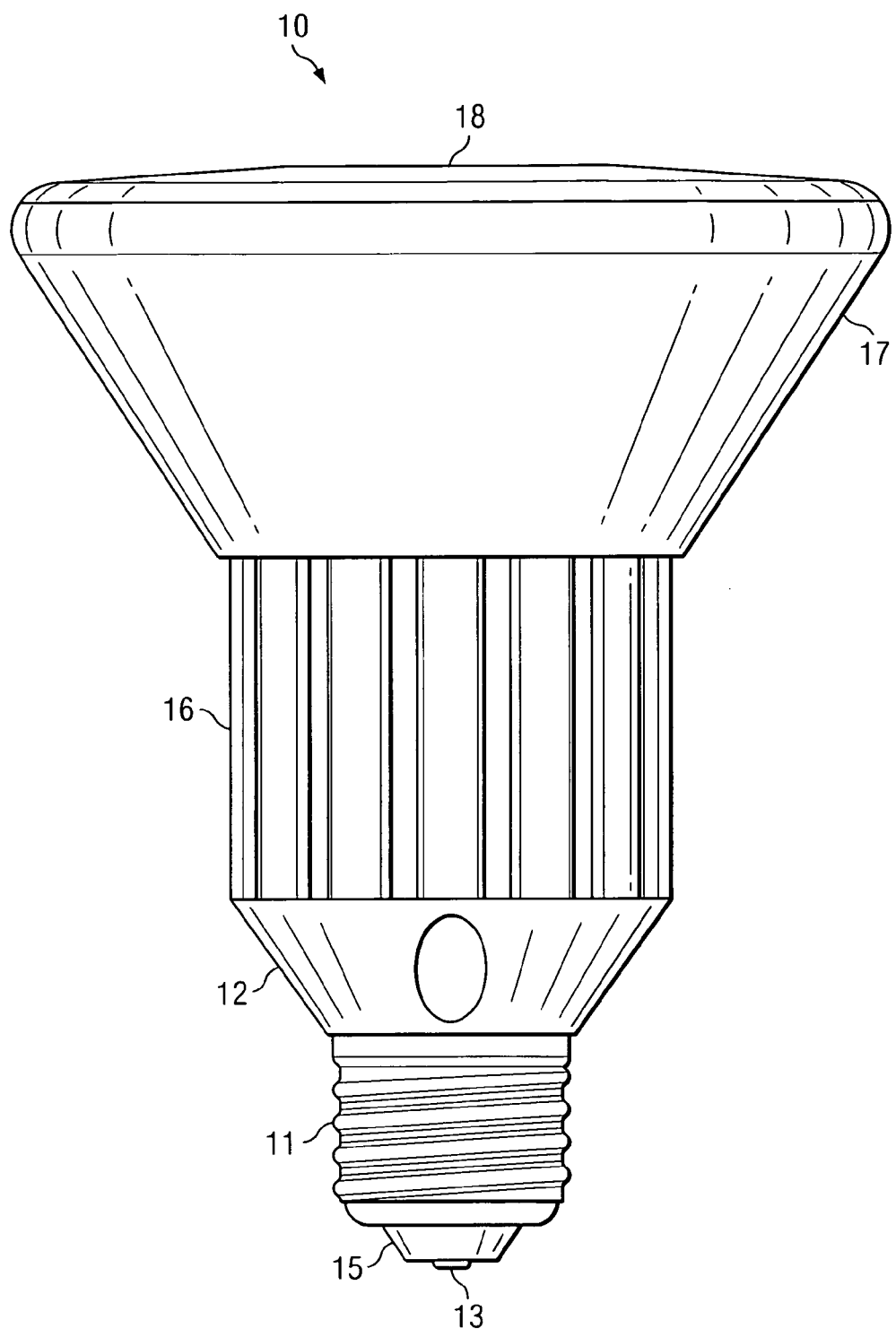
FIG. 1 is a diagrammatic elevational side view of an apparatus that is a lightbulb, and that embodies aspects of the present invention.

FIG. 1 is a diagrammatic elevational side view of an apparatus that is a lightbulb 10, and that embodies aspects of the present invention. The lightbulb 10 includes a threaded base 11, the exterior of which conforms to an industry standard known as an E26 or E27 type base, or more commonly a medium "Edison" base. Alternatively, however, the base could have any of a variety of other configurations, including but not limited to a candelabra, mogul or bayonet base. The base 11 serves as an electrical connector, and has two electrical contacts. In particular, the metal threads on the side of the base serve as a first contact, and a metal "button" 13 on the bottom of the base serves as a second contact. The two contacts are electrically separated by an insulating material 15.

Above the base 11 is a frustoconical cover 12, and above the cover 12 is a heatsink 16. A frustoconical bezel 17 is provided at the upper end of the heatsink 16, and a circular lens 18 is coupled to the upper end of the bezel 17. These parts are each discussed in more detail below.

Figure 2:
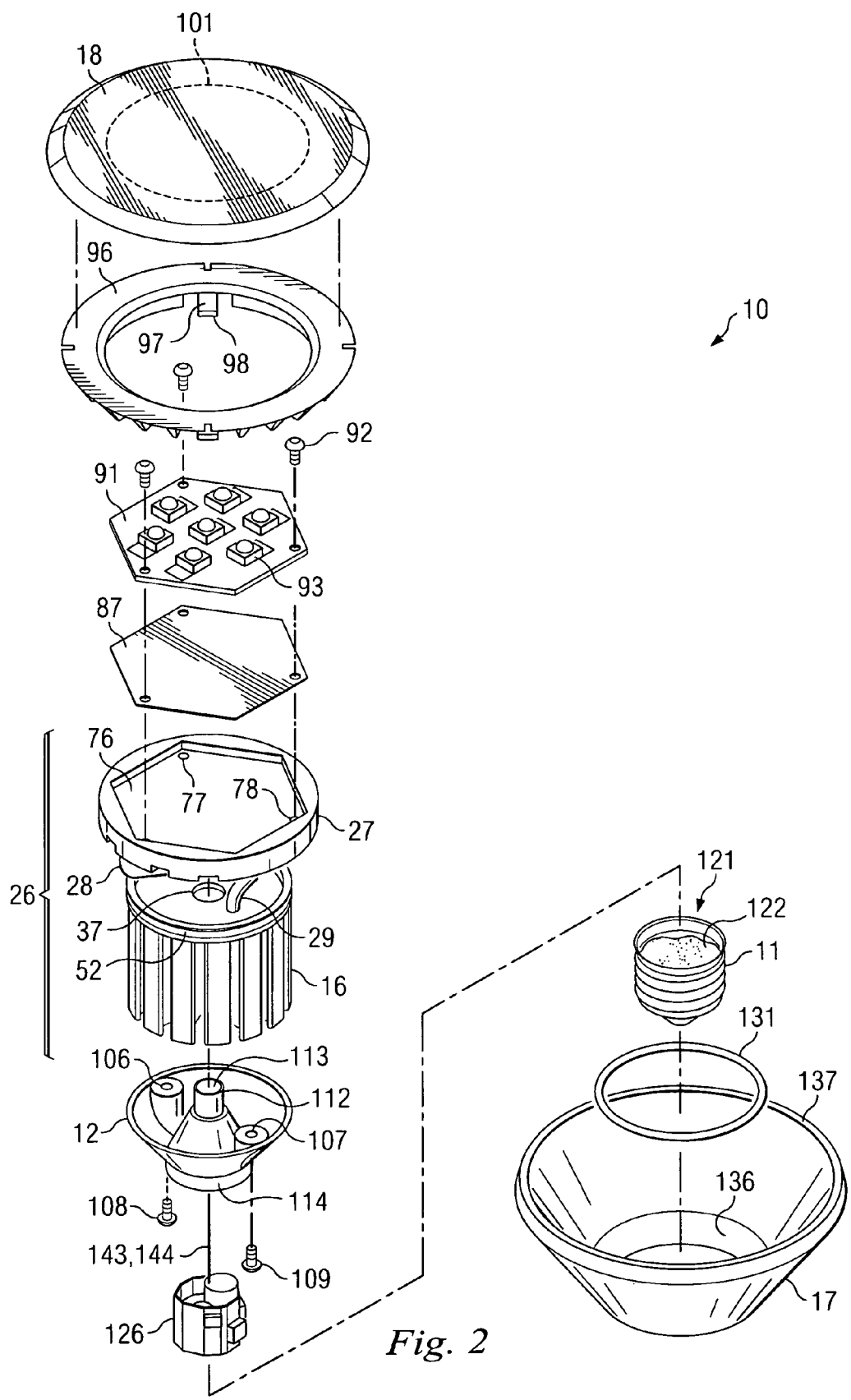
FIG. 2 is a diagrammatic exploded perspective view of the lightbulb of FIG. 1.
Figure 3:
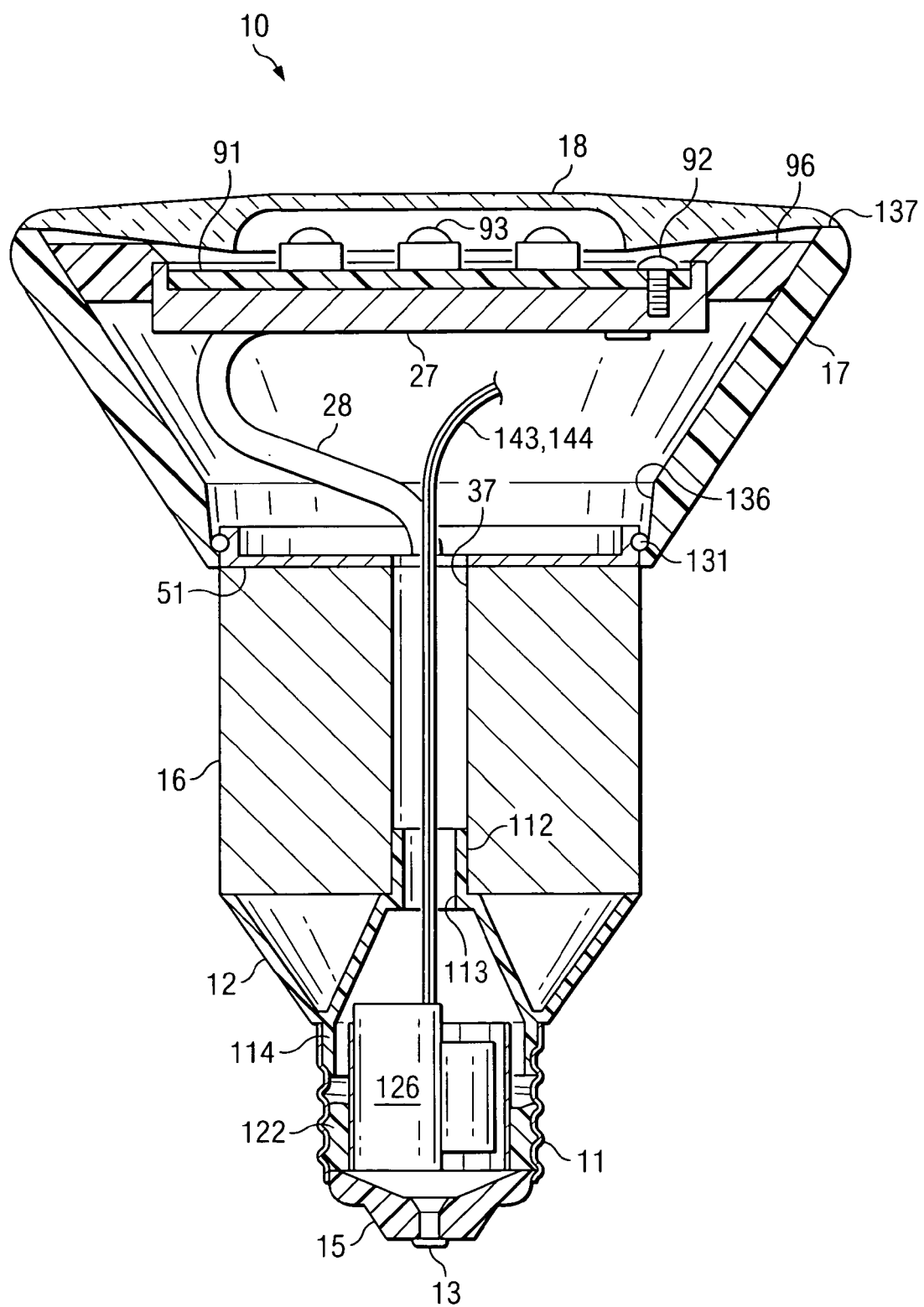
FIG. 3 is a diagrammatic sectional side view of the lightbulb of FIG. 1.

FIG. 2 is a diagrammatic exploded perspective view of the lightbulb 10, and FIG. 3 is a diagrammatic sectional side view of the lightbulb 10. With reference to the central portion of FIG. 2, the lightbulb 10 includes a heat transfer assembly 26, of which the heatsink 16 is a component part.

Figure 4:
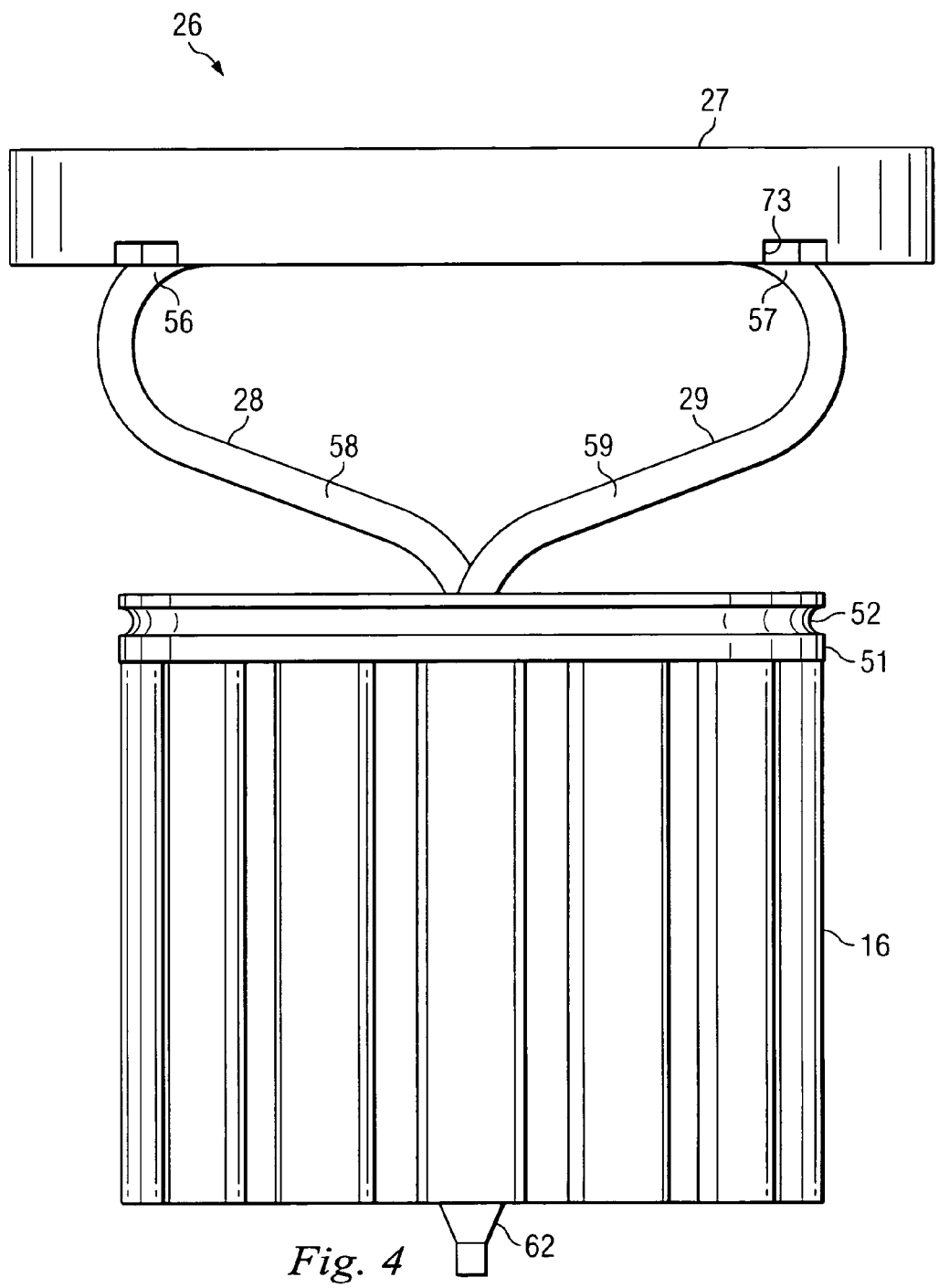
FIG. 4 is a diagrammatic elevational front view of a heat transfer assembly that is part of the lightbulb of FIG. 1.
Figure 5:
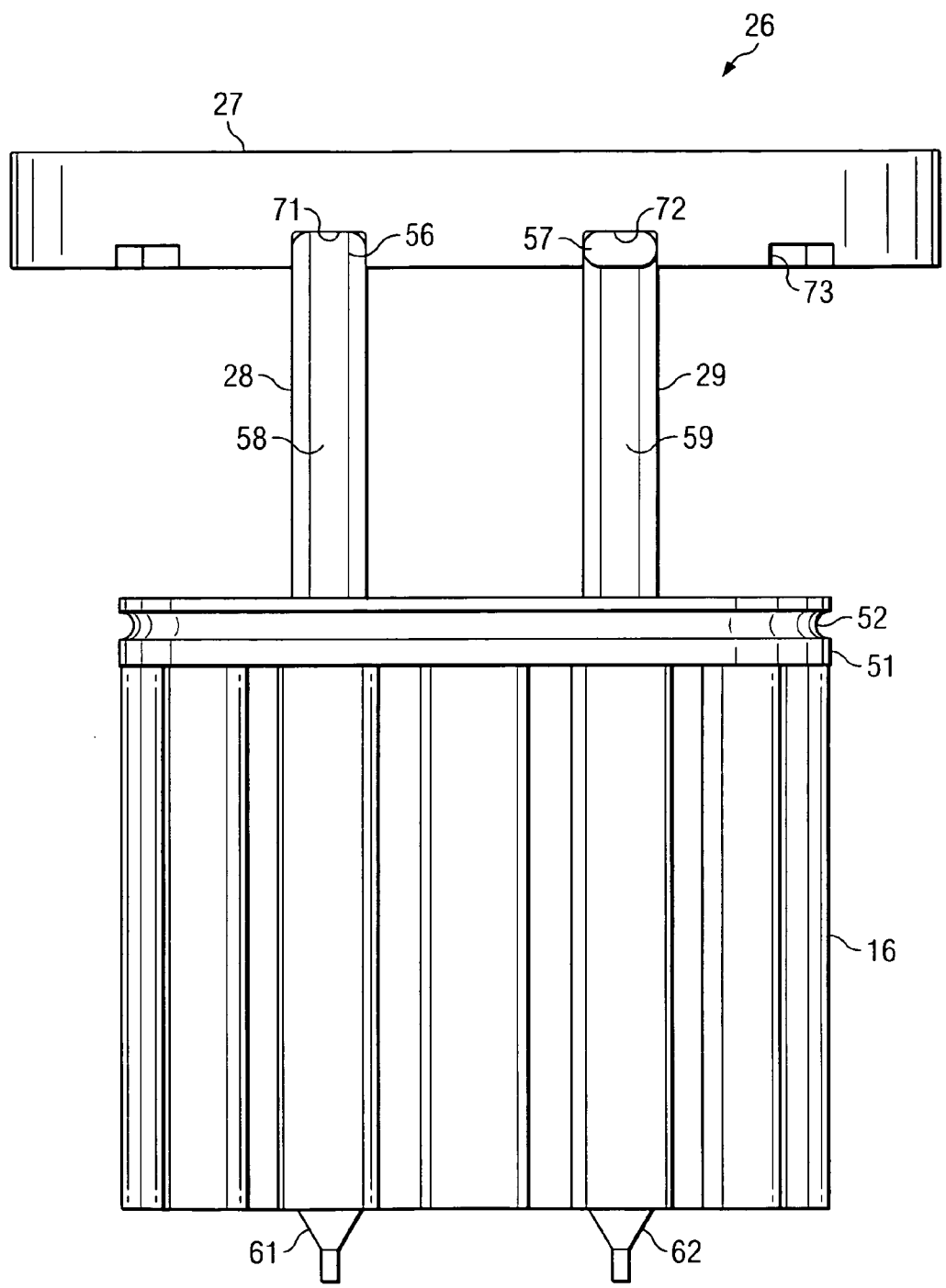
FIG. 5 is a diagrammatic elevational side view of the heat transfer assembly of FIG. 4.
Figure 6:
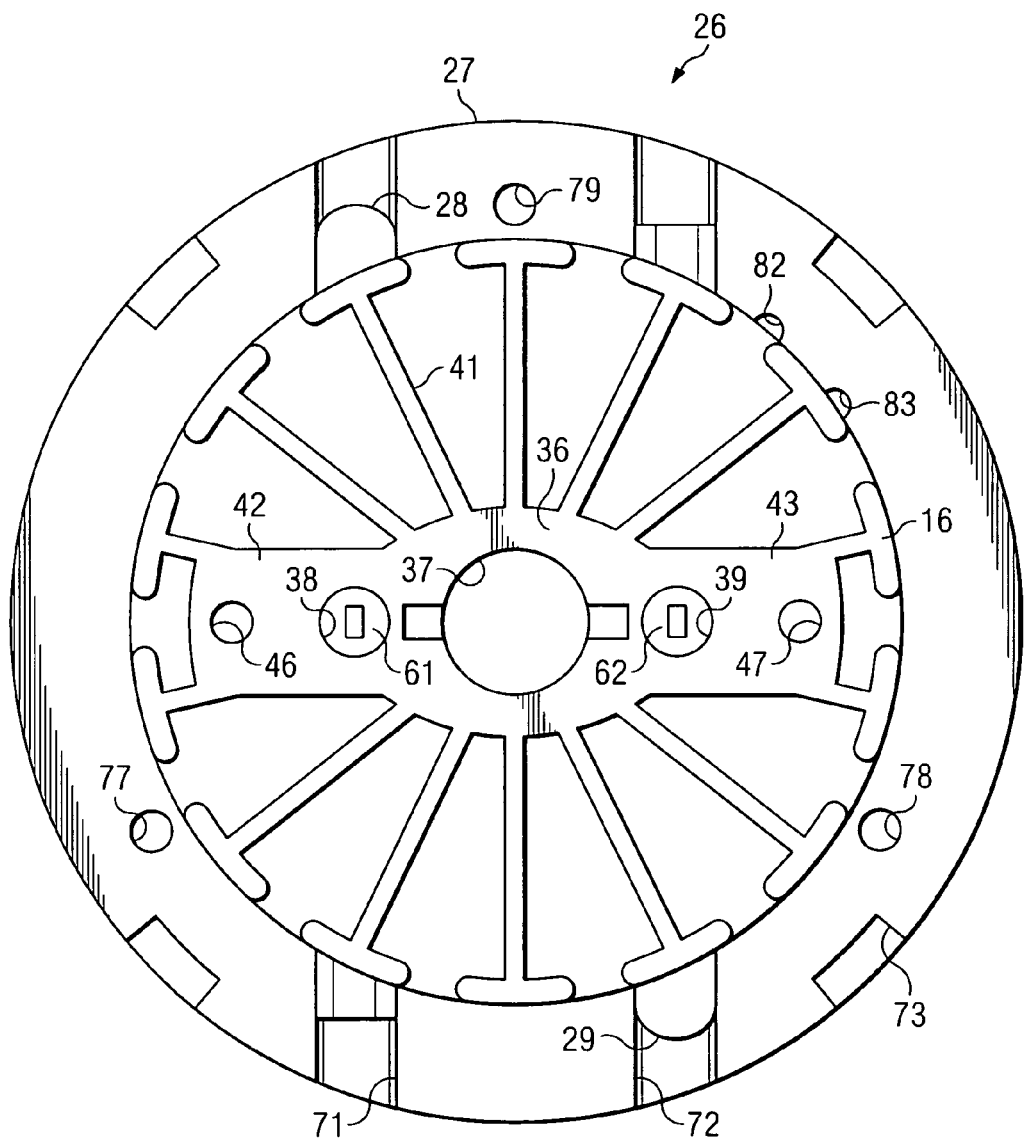
FIG. 6 is a diagrammatic bottom view of the heat transfer assembly of FIG. 4.

FIG. 4 is a diagrammatic elevational front view of the heat transfer assembly 26, FIG. 5 is a diagrammatic elevational side view of the heat transfer assembly 26, and FIG. 6 is a diagrammatic bottom view of the heat transfer assembly 26. In addition to the heatsink 16, the heat transfer assembly 26 includes a heat spreader plate 27, and two heat pipes 28 and 29. The heatsink 16 is made from a thermally conductive material. In the disclosed embodiment, the heatsink 16 is made from extruded aluminum. However, it could alternatively be made of any other suitable material that is thermally conductive.

With reference to FIG. 6, the heatsink 16 has a hub 36 with a central cylindrical opening 37 extending vertically therethrough. A plurality of fins extend radially outwardly from the hub 36, and three of these fins are designated by reference numerals 41, 42 and 43. The fins 42 and 43 are disposed on diametrically opposite sides of the hub 36, and are wider than the other fins. The fins 42 and 43 each have a respective hole 38 or 39 extending vertically therethrough. The holes 38 and 39 each receive one end of a respective one of the heat pipes 28 and 29, as discussed later. The fins 42 and 43 each have a further vertical hole extending a short distance thereinto from the bottom surface of the heatsink. The holes 46 and 47 are each internally threaded.

As best seen in FIGS. 4 and 5, the heatsink 16 has at its upper end, immediately above the radial fins, a circular plate-like portion 51. A circumferentially extending annular groove 52 is provided in the radially outer edge of the plate-like portion 51.

Still referring to FIGS. 4 and 5, the heat pipes 28 and 29 each have approximately the shape of a question mark. More specifically, each heat pipe has a horizontally-extending top end portion 56 or 57, a curved central portion 58 or 59, and a vertically-extending bottom end portion 61 or 62. The bottom end portions 61 and 62 are each disposed in a respective one of the vertical openings 38 and 39 (FIG. 6) through the heatsink 16. As evident from FIGS. 4 and 5, the bottom end portions 61 and 62 each project a short distance below the bottom surface of the heatsink 16.

The heat pipes 28 and 29 have an internal structure that allows them to operate properly in any orientation. Moreover, as discussed earlier, an LED operates less efficiently and produces less light at temperatures higher than about 25° C. More specifically, above 25° C., as the operating temperature of an LED progressively increases, the light output of the LED progressively decreases. Consequently, in the disclosed lightbulb 10, it is a goal to keep the internal temperature below about 60° C. Accordingly, the heat pipes 28 and 29 need to be capable of operating at ambient temperatures below 60° C., and thus below the boiling point of water (100° C.). Heat pipes having a suitable internal structure and operation can be obtained commercially under the trade name Therma-Charge™ from Thermacore International, Inc. of Lancaster, Pa. Alternatively, however, the heat pipes 28 and 29 could have any other suitable internal structure. For example, and without limitation, the heat pipes 28 and 29 could include or be replaced with parts that include carbon nanotubes, fabric, micro spun metals, or some other suitable type of material.

The heat spreader plate 27 is made from a thermally conductive material that, in the disclosed embodiment, is cast aluminum. However, the heat spreader plate 27 could alternatively be made of any other suitable material that is thermally conductive. With reference to FIGS. 5 and 6, the underside of the heat spreader plate 27 has two spaced, parallel grooves 71 and 72 therein. The grooves 71 and 72 each receive the top end portion 56 or 57 of a respective one of the heating pipes 28 and 29. The heat spreader plate 27 also has four notches 73 provided at circumferentially spaced locations along the lower outer edge thereof.

Figure 7:
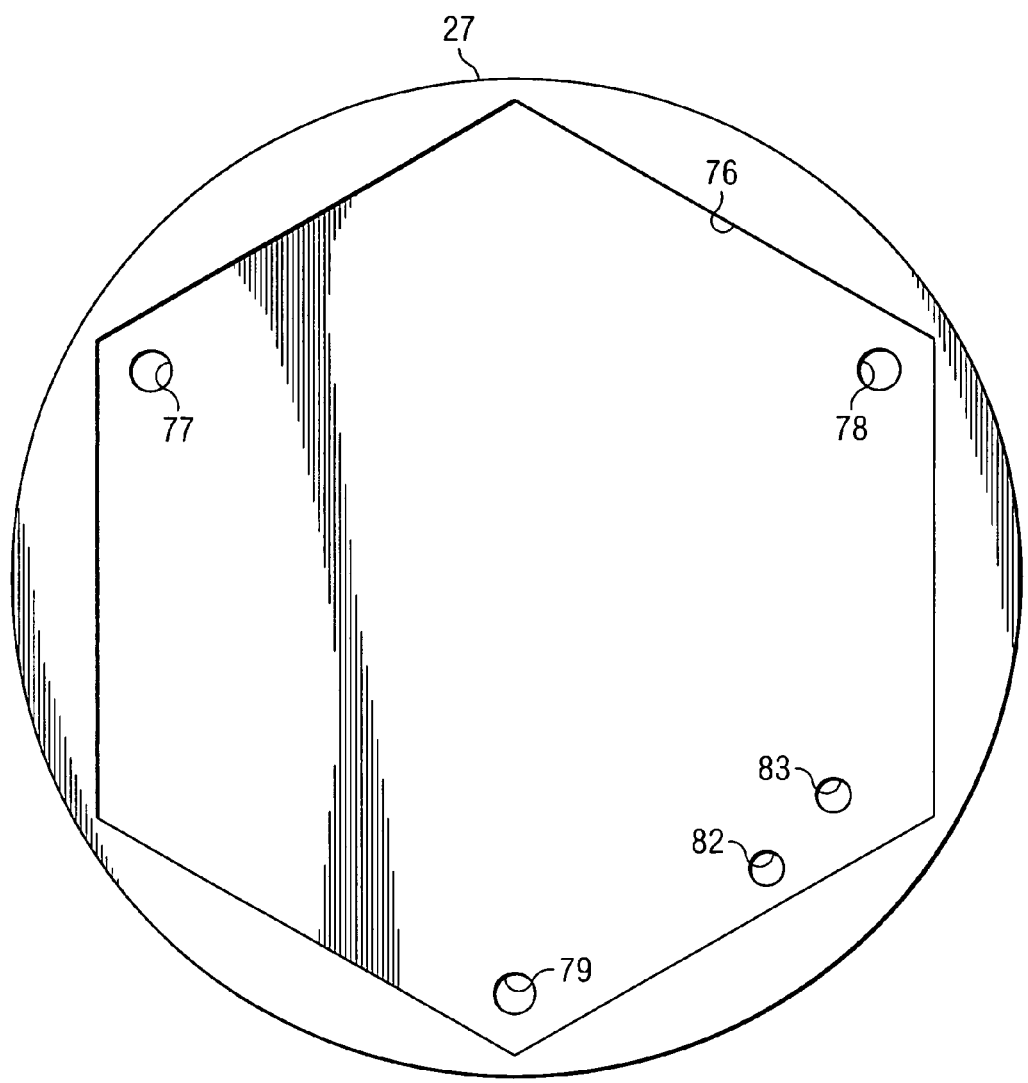
FIG. 7 is a diagrammatic top view of a heat spreader plate that is a component of the heat transfer assembly of FIG. 4.

FIG. 7 is a diagrammatic top view of the heat spreader plate 27. With reference to FIGS. 2 and 7, a shallow hexagonal recess 76 is provided in the top side of the heat spreader plate 27. Three threaded holes 77-79 extend vertically through the spreader plate 27 at locations that are equally angularly spaced from each other. The holes 77-79 are offset laterally from each of the grooves 71 and 72, and the upper ends of the holes 77-79 open into the shallow recess 76. With reference to FIGS. 6 and 7, two further holes 82 and 83 also extend vertically through the spreader plate 27. The holes 82 and 83 are spaced from each other, are offset angularly from the holes 77-79, open into the shallow recess 76 at their upper ends, and are provided at locations that are offset from each of the grooves 71 and 72.

With reference to FIG. 2, a hexagonal sheet 87 is disposed in the shallow hexagonal recess 76 of the spreader plate 27. The sheet 87 has five holes therethrough, and each of these five holes is aligned with a respective one of the holes 77-79 and 82-83 in the plate 27. The sheet 87 is made from a material that is thermally conductive and electrically insulating. In the disclosed embodiment, the sheet 87 is made from a material that is available commercially under the trade name HI-FLOW™ from The Bergquist Company of Chanhassen, Minn. However, the sheet 87 could alternatively be made of any other suitable material.

Still referring to FIG. 2, the lightbulb 10 includes a hexagonal circuit board 91 that is disposed in the shallow recess 76 of the spreader plate 27, just above the sheet 87. The circuit board 91 and the sheet 87 are secured in place on the spreader plate 27 by three screws 92, which each extend through aligned holes in the circuit board 91 and the sheet 87, and which each threadedly engage a respective one of the holes 77-79 in the spreader plate 27. Since the sheet 87 is thermally conductive, it facilitates an efficient transfer of heat from the circuit board 91 to the spreader plate 27. And since the sheet 87 is electrically insulating, it prevents the aluminum spreader plate 27 from creating electrical shorts between different portions of the circuitry on the circuit board 91.

Seven radiation generators 93 are mounted on the circuit board 91. In the disclosed embodiment, the radiation generators 93 are each a light emitting diode (LED) that emits visible light. However, the radiation generators 93 could alternatively be other types of devices, or could emit electromagnetic radiation at some other wavelength, such as infrared radiation or ultraviolet radiation. As another alternative, one subset of the illustrated radiation generators 93 could emit radiation at one wavelength, and another subset could emit radiation at a different wavelength. For example, one subset could emit visible light, and another subset could emit ultraviolet light. As still another alternative, some or all of the radiation generators 93 could be coated with a phosphor, so that they emit a multiplicity of wavelengths.

FIG. 2 depicts a spacer 96. The spacer 96 is a circular ring that has four downwardly projecting tabs 97 at equally angularly spaced intervals. The tabs 97 are each resiliently flexible, and each have an inwardly projecting ridge 98 at the lower end thereof. The ridges 98 can each snap into a respective one of the notches 73 (FIG. 4) provided in the spreader plate 27, in order to releasably secure the spacer 96 to the spreader plate 27. In the disclosed embodiment, the spacer 96 is made from a commercially available plastic of a known type. However, it could alternatively be made of any other suitable material.

The circular lens 18 is disposed above the spacer 96. In the disclosed embodiment, the lens 18 is made from a clear plastic material, for example the same plastic material used to make the spacer 96. However, the lens 18 could alternatively be made from any other suitable material. In FIG. 2, a broken line 101 encircles a center portion of the lens 18. An opaque coating mau optinally be provided on an annular portion of the inner surface of the lens 18 that lies outside the circle 101, for example a white coating.

With reference to FIG. 2, the cover 12 has two spaced openings 106 and 107 that extend vertically therethrough, on opposite sides of a central vertical axis thereof. Two screws 108 and 109 each extend through a respective one of the openings 106 and 107, and threadedly engage a respective one of the openings 46 and 47 (FIG. 6) that are provided in the bottom of the heatsink 16. The screws 108 and 109 thus fixedly secure the cover 12 to the underside of the heatsink 16.

The cover 12 has a cylindrical upward projection 112 in the center thereof. The projection 112 extends into the central opening 37 (FIG. 6) in the hub 36 of the heatsink 16. A cylindrical vertical opening 113 is provided in the projection 112, and extends completely through the cover 12. The underside of the cover 12 has a short downward projection 114 of cylindrical shape. In the disclosed embodiment, the cover 12 is made from a plastic material, which may for example be the same plastic material used for the spacer 96 and the lens 18. However, the cover 12 could alternatively be made from any other suitable material.

The base 11 is a cup-shaped part, with an upwardly-open cylindrical recess 121 therein. The upper end of the recess 121 receives the downward projection 114 on the cover 12, and these parts are fixedly secured to each other in any suitable matter, for example by a suitable adhesive. The recess 121 in the base 11 contains a potting or overmolding material 122 of a known type, and a power supply unit 126 is embedded within the potting material 122. The power supply unit 126 is discussed in more detail later.

In the disclosed embodiment, the bezel 17 is made from a plastic material, which may for example be the same plastic material used for the cover 12, the spacer 96 and the lens 18. However, the bezel 17 could alternatively be made of any other suitable material. FIG. 2 shows an O-ring 131, which is received in the annular groove 52 at the upper end of the heatsink 16. The lower end of the bezel 17 has a radially inwardly facing annular surface portion 136 that sealingly engages the outer side of the O-ring 131. At its upper end, the bezel 17 has an upwardly-facing annular surface portion 137 that engages the peripheral edge of the lens 18. The annular surface portion 137 on the bezel 17 is fixedly secured to the peripheral edge of the lens 18. In the disclosed embodiment, the bezel 17 and the lens 18 are each made of a plastic material, and are fixedly secured together by an ultrasonic weld that extends around the entire circumferential edge of the lens 18. Alternatively, however, the bezel 17 and the lens 18 could be fixedly secured together in any other suitable manner.

Figure 8:
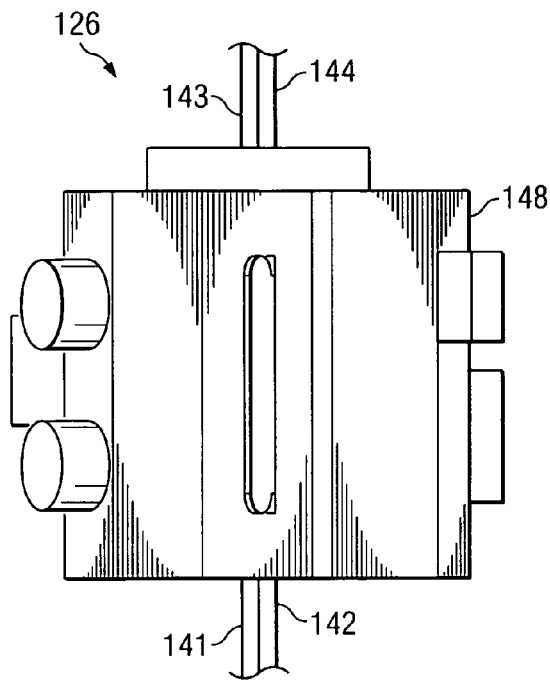
FIG. 8 is a diagrammatic elevational side view that shows, in an enlarged scale, a power supply unit that is a component of the lightbulb of FIG. 1.

FIG. 8 is a diagrammatic elevational side view showing the power supply unit 126 of FIG. 2 in an enlarged scale. Two wires 141 and 142 each have one end electrically coupled to the power supply unit 126, and each extend away from the underside of the unit 126 through the potting compound 122 (FIG. 2). One of the two wires 141 and 142 has its outer end electrically coupled to the contact 13 (FIG. 1) on the bottom of the base 11, and the other wire has its outer end coupled to the threaded metal sidewall of the base 11.

Two further wires 143 and 144 each have a lower end that is coupled to the power supply unit 126, and each extend upwardly away from the power supply unit. In particular, the wires 143 and 144 each extend through the opening 113 in the cover 12, and through the opening 37 in the heatsink 16. Each of the wires 143 and 144 then extends through a respective one of the two openings 82 and 83 in the thermal spreader plate 27, and through a respective one of the two corresponding openings in the sheet 87. The upper ends of the wires 143 and 144 are each soldered to the circuit board 91.

Figure 9:
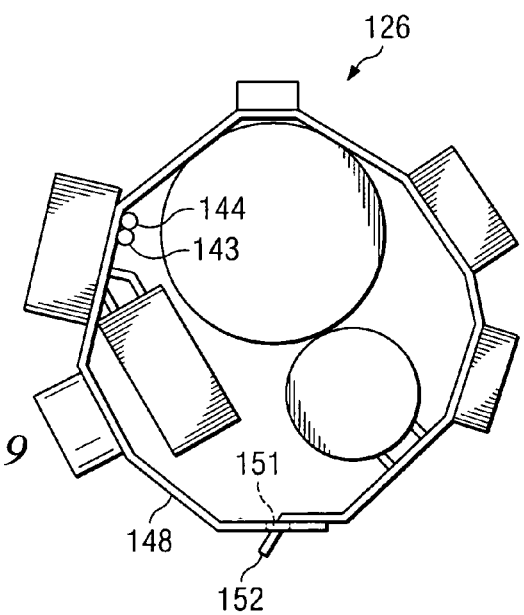
FIG. 9 is a diagrammatic top view of the power supply unit of FIG. 8.
Figure 10:
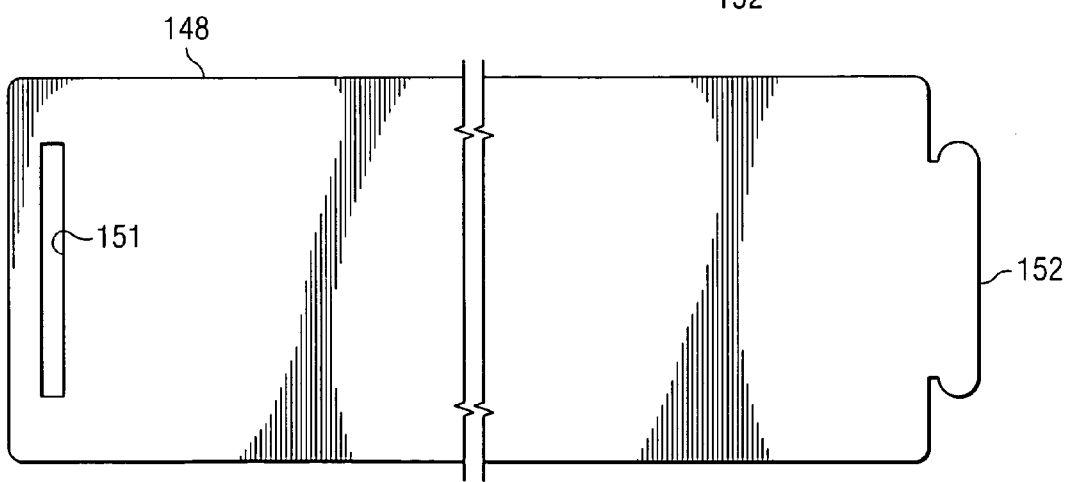
FIG. 10 is a diagrammatic elevational side view of a flexible circuit carrier that is a component of the power supply unit of FIG. 8, before circuit components are mounted thereon, and before the carrier is bent to its operational configuration shape.

FIG. 9 is a diagrammatic top view of the power supply unit 126. The power supply unit 126 includes a flexible circuit carrier 148, which is a type of component that is often referred to in the art as a flexible circuit board, or a flex circuit. In the illustrated embodiment, the carrier 148 is made of a polyimide or mylar material, but could alternatively be made of any other suitable material. FIG. 10 is a diagrammatic elevational side view of the flexible circuit carrier 148, before circuit components are mounted thereon, and before it is bent to its operational configuration shape. It will be noted from FIG. 10 that the flexible circuit carrier 148 is elongate, has a slot 151 near one end, and has a tab 152 at the other end. After circuit components have been mounted on the flexible circuit carrier 148, the carrier 148 is bent to form approximately a loop or ring, as best seen in FIG. 9. The tab 152 is then inserted through the slot 151, in order to help maintain the carrier in this configuration. It would alternatively be possible to omit the slot 151 and tab 152 from the carrier 148, and to couple the adjacent ends of the carrier to each other in some other manner, for example, by placing a piece of double-sided tape between the adjacent ends of the carrier. As discussed above in association with FIG. 2, the power supply unit 126, including the carrier 148, is at least partially embedded in the potting material 122, in order to prevent the power supply unit 126 from moving around within the base 11, and to help maintain the flexible carrier 148 in its configuration as a loop or ring. Although the carrier 148 in the illustrated embodiment is bent to form a loop or ring, it would alternatively be possible for it to have any of a variety of other configurations, including but not limited to a folded configuration, a coiled configuration. As still another alternative, it could be a molded part with a ring-like cylindrical shape, or some other suitable shape.

Figure 11:
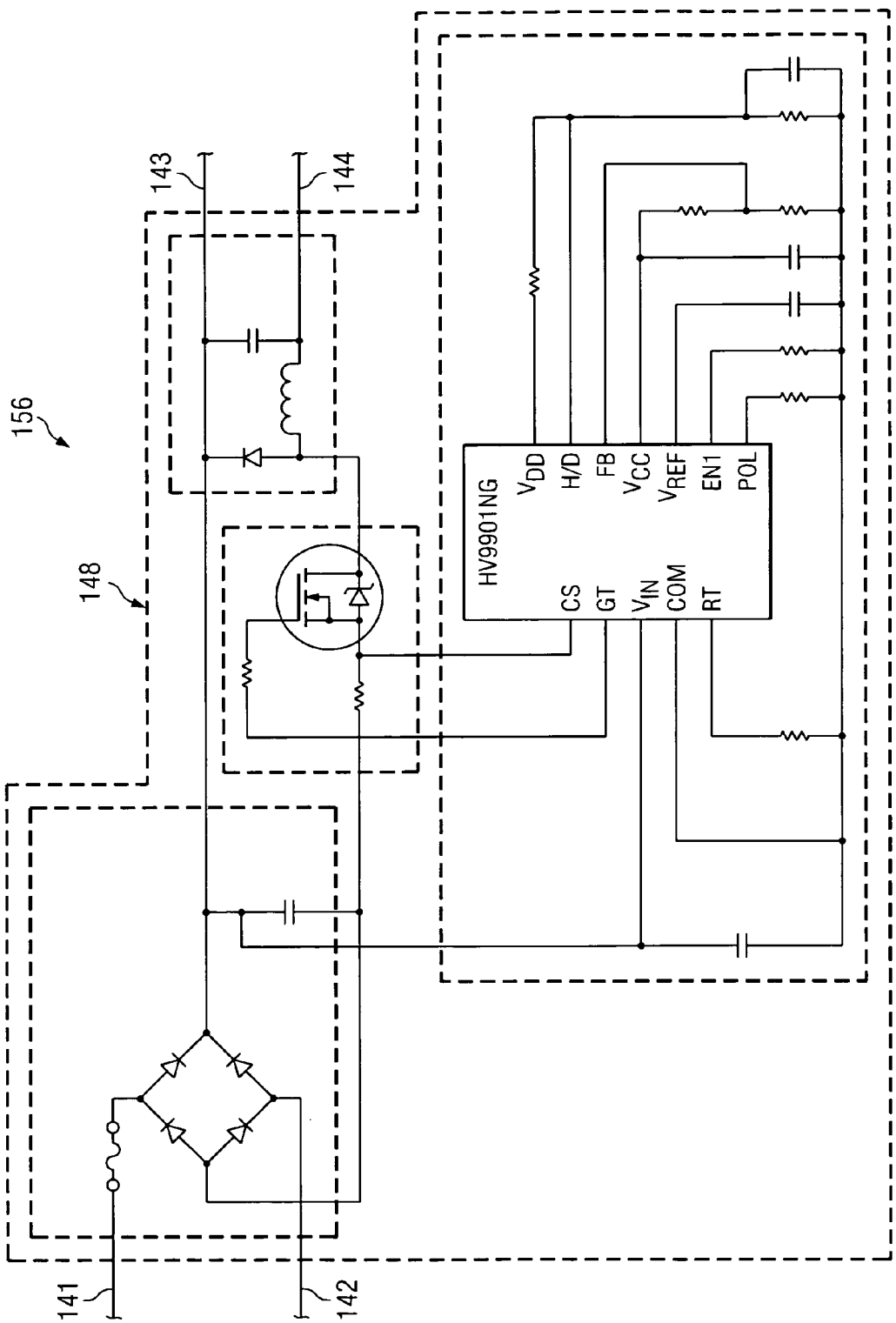
FIG. 11 is a schematic diagram of the circuitry of the power supply unit of FIG. 8.

FIG. 11 is a schematic diagram of the circuitry 156 of the power supply unit 126, or in other words the circuitry that is mounted on the flexible circuit carrier 148. Details of the configuration and operation of the circuitry 156 are not needed in order to understand of the present invention, and are therefore not described here in detail. Instead, the circuitry 156 is depicted in FIG. 11 primarily for the purpose of completeness. With respect to how the circuitry 156 is depicted in FIG. 11, the wires 141 and 142 connect to the circuitry on the left side, and the wires 143 and 144 connect to the circuitry on the right side.

In operation, electrical power is received through the base 11, and is carried through the wires 141 and 142 to the circuitry 156 of the power supply unit 126 (FIG. 11). The carrier 148 and potting material 122 serve as electrical insulators that electrically isolate the circuitry from the metallic base 11, while simultaneously serving as thermal conductors that carry heat from the circuitry to the metallic base 11, so that the heat can be dissipated through the base and other parts of the bulb housing. The carrier 148 also provides signal and power paths for the circuitry.

The circuitry 156 produces an output signal that is supplied through the wires 143 and 144 to the circuit board 91, where it is applied to the LEDs on the circuit board 91. The LEDs emit radiation, for example in the form of visible light, and this radiation is transmitted out through the lens 18 to a region external to the lightbulb 10.

In addition to emitting radiation, the LEDs 93 also give off heat. Since the sheet 87 is thermally conductive and electrically insulating, it efficiently transfers heat from the LEDs 93 and the circuit board 91 to the thermal spreader plate 27, but without shorting out any of the circuitry on the circuit board 91. The spreader plate 27 then transfers the heat to the upper end portions of the two heat pipes 28 and 29. The heat then travels through the heat pipes 28 and 29 from the upper end portions thereof to the lower end portions thereof. The heat pipes 28 and 29 move heat away from the LEDs efficiently and without the aid of gravity, and thus without regard to the current orientation of the lightbulb. The heat is then transferred from the lower end portions of the heat pipes to the heatsink 16, and after that the heatsink 16 dissipates the heat by dispersing it into the air or other ambient atmosphere surrounding the lightbulb 10.

Figure 12:
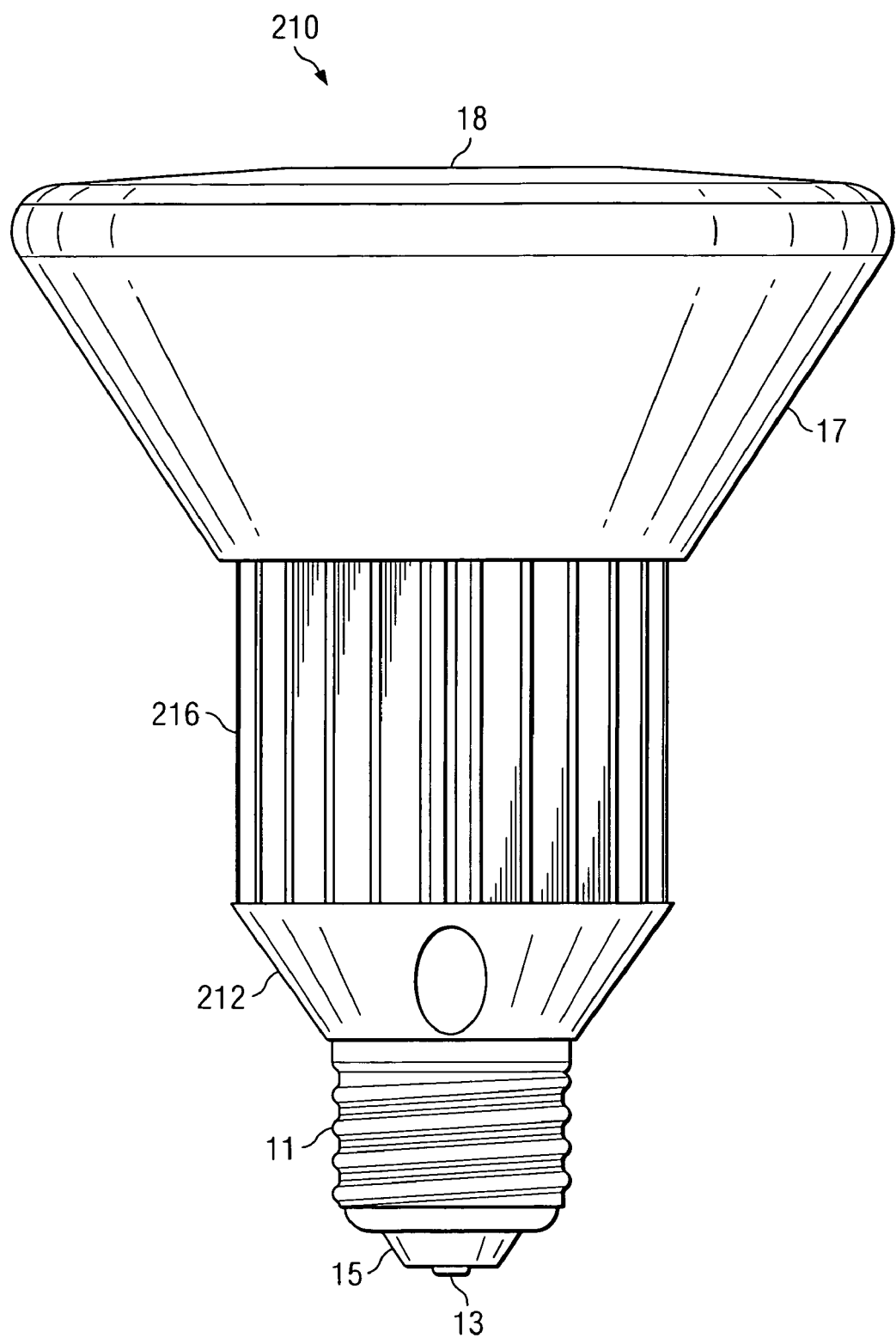
FIG. 12 is a diagrammatic elevational side view of a lightbulb that embodies aspects of the invention, and that is an alternative embodiment of the lightbulb of FIG. 1.

FIG. 12 is a diagrammatic elevational side view of a lightbulb 210 that embodies aspects of the invention, and that is an alternative embodiment of the lightbulb 10 of FIG. 1. Portions of the lightbulb 210 are similar or identical to corresponding portions of the lightbulb 10. Accordingly, they are identified with the same or similar reference numerals, and are not described below in detail. Instead, the following discussion focuses primarily on differences between the lightbulb 210 of FIG. 12 and the lightbulb 10 of FIG. 1.

Figure 13:
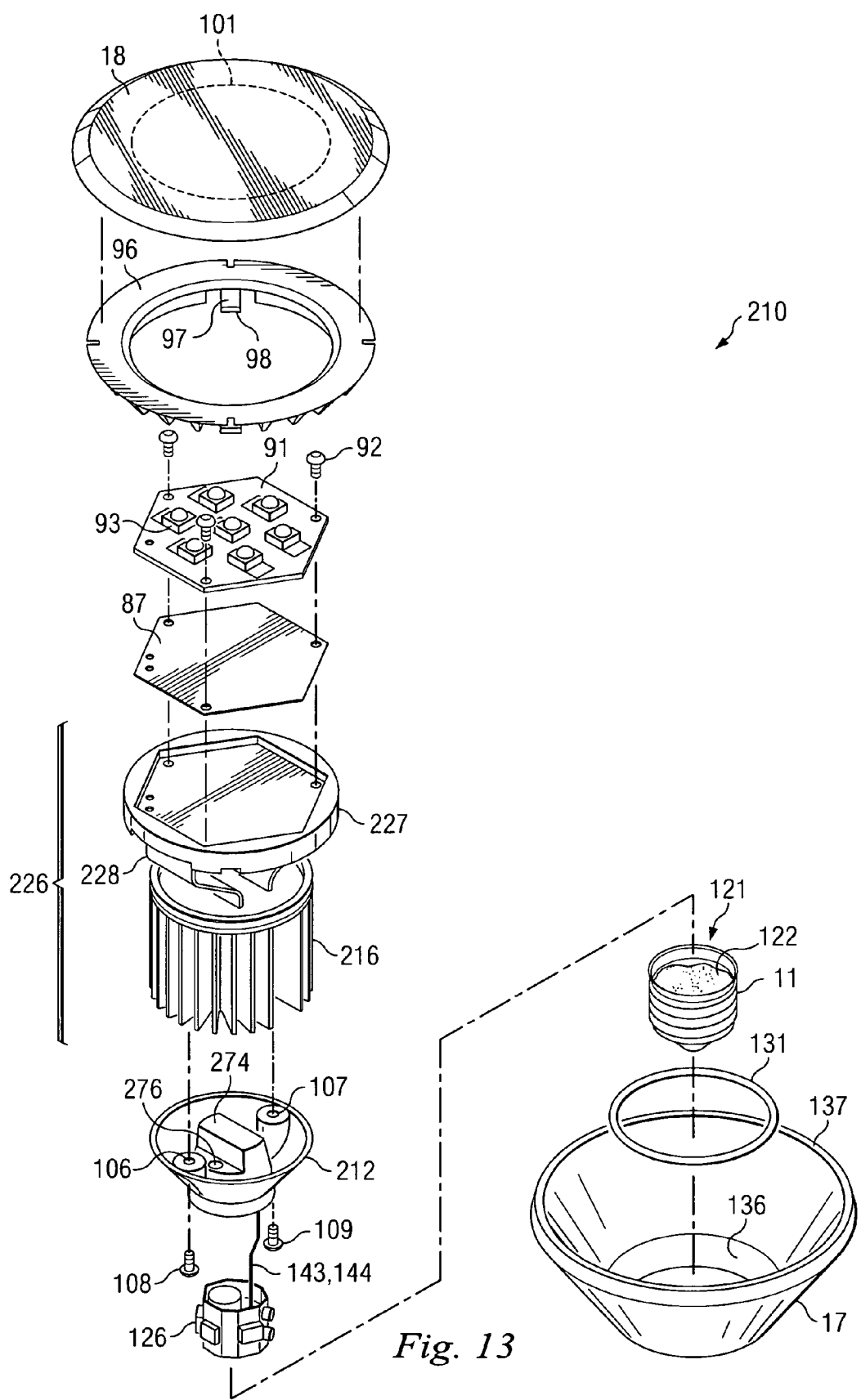
FIG. 13 is a diagrammatic perspective exploded view of the lightbulb of FIG. 12.
Figure 14:
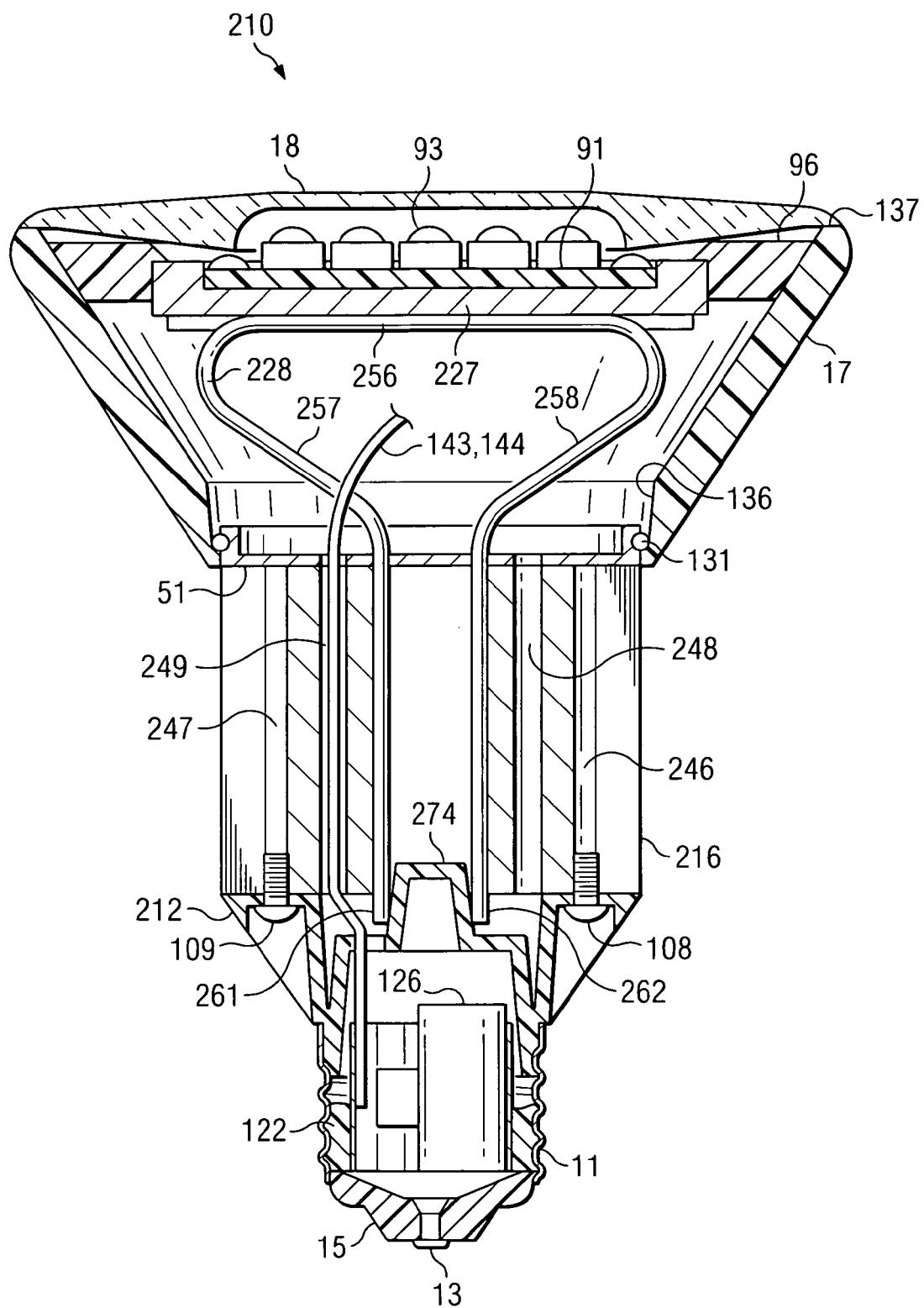
FIG. 14 is a diagrammatic sectional side view of the lightbulb of FIG. 12.

FIG. 13 is a diagrammatic perspective exploded view of the lightbulb 210 of FIG. 12, and FIG. 14 is a diagrammatic sectional side view of the lightbulb 210. With reference to FIG. 13, the lightbulb 210 has a heat transfer assembly 226 which differs in some respects from the heat transfer assembly 26 of the lightbulb 10. In this regard, FIG. 15 is a diagrammatic elevational front view of the heat transfer assembly 226, FIG. 16 is a diagrammatic elevational side view of the heat transfer assembly 226, and FIG. 17 is a diagrammatic bottom view of the heat transfer assembly 226.

Figure 15:
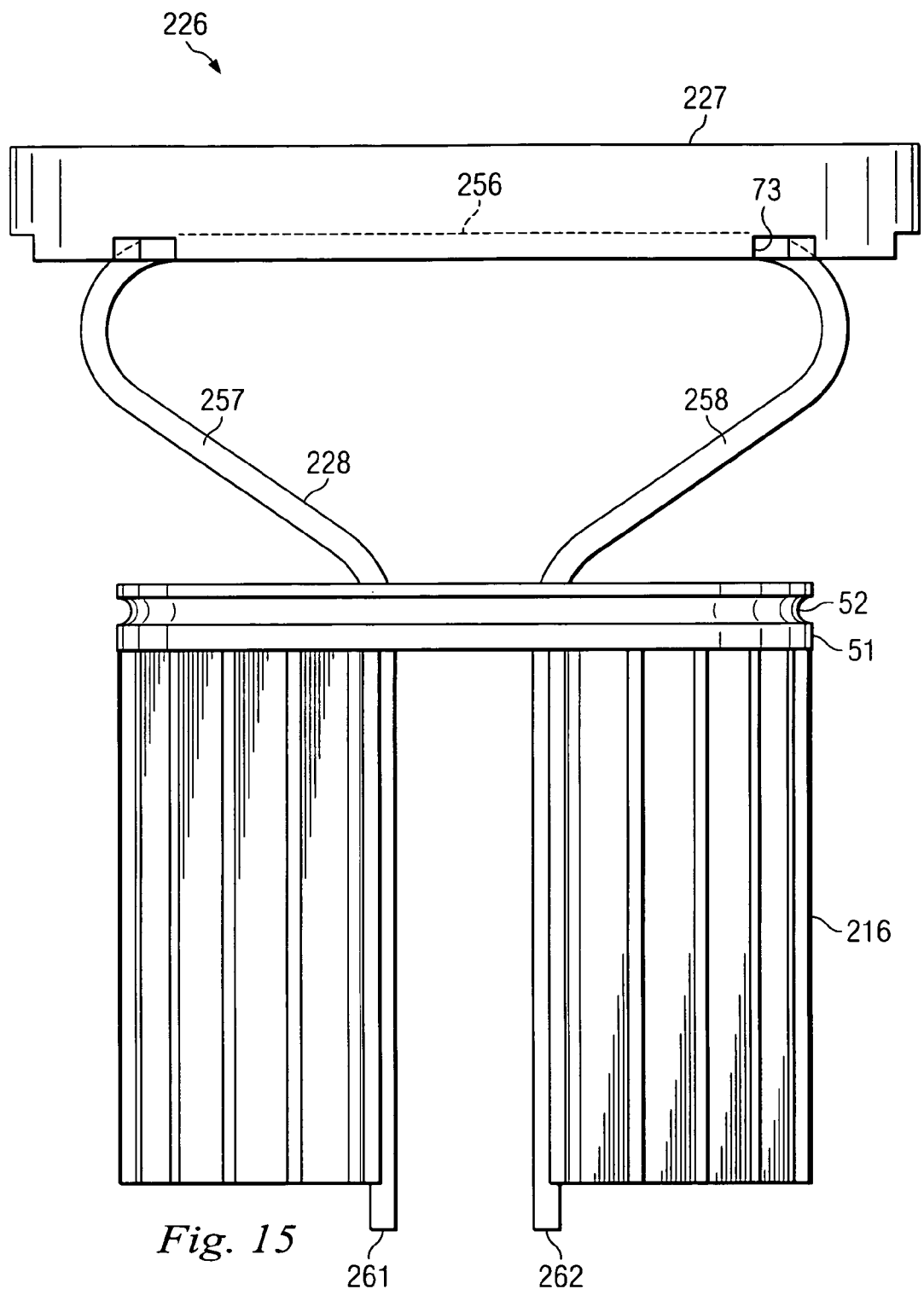
FIG. 15 is a diagrammatic elevational front view of a heat transfer assembly that is a component of the lightbulb of FIG. 12.

With reference to FIG. 15, the heat transfer assembly 226 has at the upper end thereof the plate-like portion 51 with the annular groove 52. However, the portion of heatsink 216 located below the plate-like portion 51 is different from the heatsink 16 of FIG. 1. More specifically, with reference to FIGS. 15 and 17, the heatsink 216 includes two spaced, semi-cylindrical hub portions 235 and 236. Each of the hub portions 235 and 236 has thereon a plurality of radially outwardly extending fins, some of which are identified by reference numerals 241-244. Two spaced and parallel slots 238 and 239 extend vertically through the plate-like portion 51. As best seen in the bottom view of FIG. 17, the slots 238 and 239 each have one edge that is aligned with the inner surface of a respective one of the semi-cylindrical hubs 235 and 236. The heatsink 216 has two vertical threaded openings 246 and 247 that are each disposed between an adjacent pair of radially extending fins. In addition, the semi-cylindrical hub portions 235 and 236 each have a respective opening 248 or 249 extending vertically therethrough, and the openings 248 and 249 also extend vertically through the plate-like portion 51.

With reference to FIG. 15, the heat transfer assembly 226 includes a single heat pipe 228, which is different from the two heat pipes 28 and 29 in the embodiment of FIGS. 1-11. In particular, the heat pipe 228 has a cross-sectional shape that is thin and wide. The heat pipe 228 has a horizontally-extending central portion 256 at its upper end. On each side of the central portion 256 are curved portions 257 and 258 that lead to respective vertical end portions 261 and 262. In particular, with reference to FIGS. 15 and 17, the end portions 261 and 262 each extend through a respective one of the vertical slots 238 and 239, and each have a vertical surface on one side that engages the vertical surface on the inner side of a respective one of the semi-cylindrical hub portions 235 and 236. As evident from FIGS. 15 and 16, the end portions 261 and 262 project a small distance below the bottom surface of the heatsink 216. In the disclosed embodiment, the internal structure and operation of the heat pipe 228 is equivalent to that discussed above in association with the heat pipes 28 and 29, and is therefore not described again in detail here. But any other suitable internal structure could alternatively be used.

Figure 16:
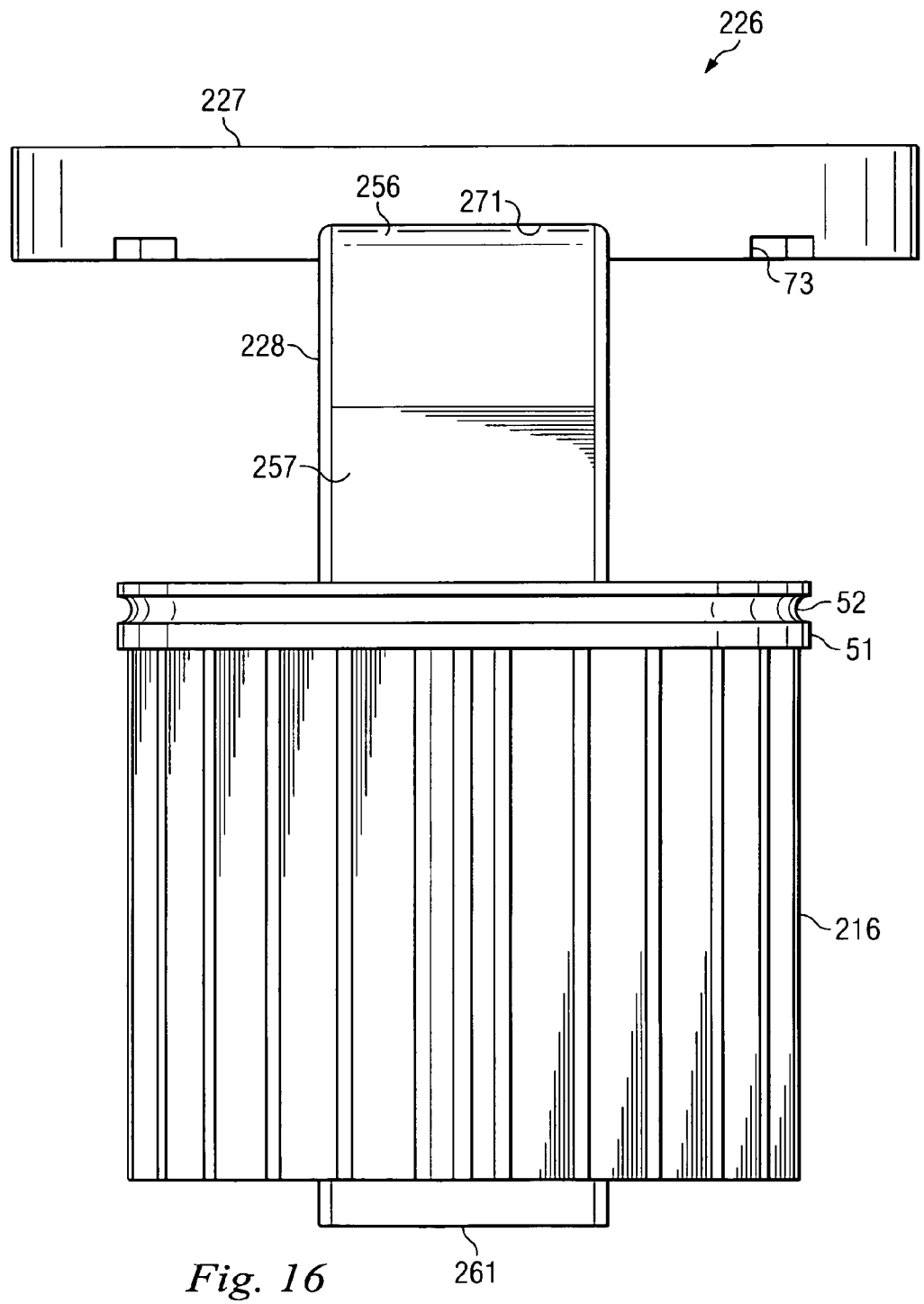
FIG. 16 is a diagrammatic elevational side view of the heat transfer assembly of FIG. 15.
Figure 17:
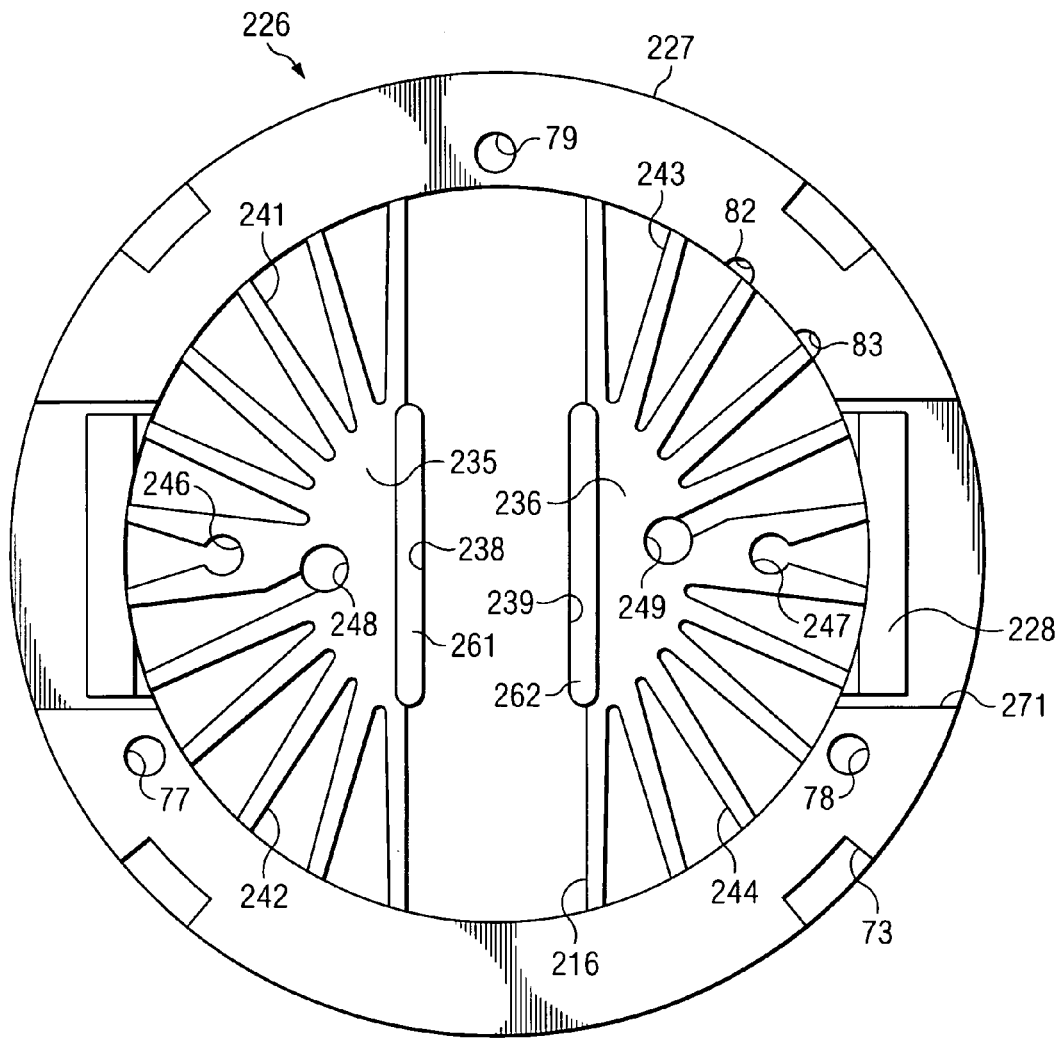
FIG. 17 is a diagrammatic bottom view of the heat transfer assembly of FIG. 15.

With reference to FIGS. 15 and 16, the upper end of the heat transfer assembly 226 is defined by a heat spreader plate 227, which has one significant difference from the heat spreader plate 27 in the embodiment of FIGS. 1-11. In particular, the heat spreader plate 227 has a single wide groove 271 in the underside thereof, rather than two spaced grooves. The central portion 256 of the heat pipe 228 is disposed in the groove 271.

With reference FIG. 13, the lightbulb 210 includes a cover 212 that is slightly different from the cover 12 in the embodiment of FIGS. 1-11. In particular, the cover 212 has in the center thereof an upward projection of rectangular shape. As shown in FIG. 14, when the cover 212 is fixedly secured to the heatsink 216 by the screws 108 and 109, the rectangular projection 274 is disposed between and engages the lower end portions 261 and 262 of the heat pipe 228, in order to help hold them in position. With reference to FIG. 13, a vertical hole 276 extends through the cover 212 at a location between the projection 274 and the opening 106. As shown in FIG. 14, the wires 143 and 144 extend upwardly from the power supply unit 126, pass through the opening 276 in the cover 212 (FIG. 13), and then extend through the vertical opening 249 in the heatsink 216.

The operation of the lightbulb 210 is generally similar to that of the lightbulb 10. In this regard, the LEDs 93 emit heat that is transferred through the circuit board 91 and the thermally conductive sheet 87 to the heat spreader plate 227, and then to the central portion 256 of the heat pipe 228 (FIGS. 14 and 15). The heat then travels downwardly through the curved portions 257 and 258 of the heat pipe 228, to the lower end portions 261 and 262 thereof. From the lower end portions 261 and 262, the heat is transferred to the heatsink 216, and the heatsink 216 then dissipates the heat by dispersing it into the air or other ambient atmosphere surrounding the lightbulb 210.

Figure 18:
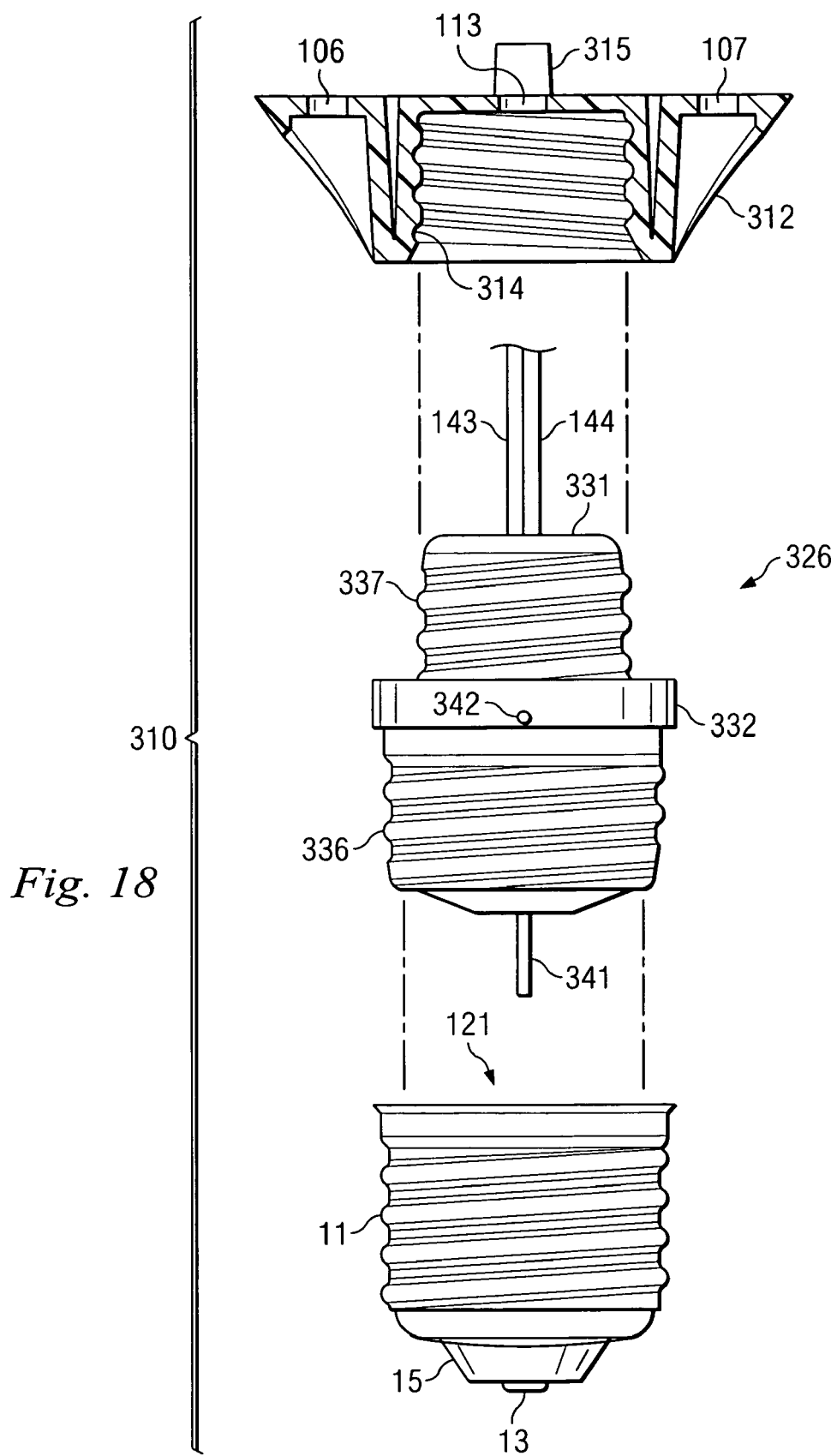
FIG. 18 is a diagrammatic exploded sectional side view of a lower portion of a further alternative embodiment of the lightbulb of FIG. 1.

FIG. 18 is a diagrammatic exploded sectional side view of a lower portion 310 of an alternative embodiment of the lightbulb 10 of FIGS. 1-11. Parts that are equivalent to parts in the lightbulb 10 are identified in FIG. 18 with the same reference numerals, and are not described again in detail. Instead, the following discussion will focus primarily on differences between the embodiment of FIG. 18 and the embodiment of FIGS. 1-11.

The lower portion 310 includes a base 11 that is identical to the base 11 shown in FIG. 1. The base 11 in FIG. 18 does not contain any of the potting compound 122 (FIG. 2). Since the metal material of the base 11 is bent to form the external threads thereon, the inner surface of the base 11 has a similar shape and defines corresponding internal threads.

The lower portion 310 includes a cover 312 with a central recess 314 that opens downwardly, and that is internally threaded. The diameter of the recess 314 is less than the diameter of the recess 121 in the base 11. The upper end of the recess 314 communicates with the lower end of the central opening 113 that extends vertically through the cover 312. the top of the cover 312 has two spaced, upward projections located on opposite sides of the opening 113, and one of these two projections is visible at 315.

Between the base 11 and the cover 312 is a power supply unit 326. The power supply unit 326 has a member or body 331 that is made from an electrically non-conductive material. In the disclosed embodiment, the member 331 is made from a relatively hard and durable plastic. However, it could alternatively be made from any other suitable material. A radially outwardly projecting annular flange 332 is provided approximately at the vertical center of the member 331. The member 331 has a lower end portion 336 below the flange 332, and an upper end portion 337 above the flange 332. The diameter of the upper end portion 337 is less than the diameter of the lower end portion 336. The lower end portion 336 and the upper end portion 337 are each externally threaded. Fixedly embedded and encapsulated within the material of the member 331 is a not-illustrated power supply unit that, in the disclosed embodiment, is effectively identical to the power supply unit shown at 126 in FIG. 8. In FIG. 18, it will be noted that the wires 143 and 144 extend outwardly through the top of the upper end portion 337.

A first cylindrical electrode has one end fixedly secured in the lower end of the member 331, and projects downwardly along the central vertical axis of the member 331. A second cylindrical electrode 342 has one end fixedly secured in the annular flange 332, and projects radially outwardly from the lower edge of the flange 332. Within the member 331, the wires 141 and 142 (FIG. 8) of the power supply unit are each electrically coupled to a respective one of the electrodes 341 and 342 (FIG. 18).

The threaded upper portion 337 of the member 331 engages the threaded recess 314 provided in the cover 312. The threaded lower portion 336 engages the threaded recess 121 provided in the base 11. The lower end of the electrode 341 engages the top of the button electrode 13, so that they are in electrical contact. The electrode 342 slidably engages the top edge of the metal sidewall of the base 11, so that they are in electrical contact.

Although selected embodiments have been illustrated and described in detail, it should be understood that a variety of substitutions and alterations are possible without departing from the spirit and scope of the present invention, as defined by the claims that follow. For example, the shapes and structural configurations of many of the parts described above can be varied without departing from the invention. Also, references in the foregoing discussion to various directions, such as up, down, in and out, are used in relation to how the disclosed embodiments happen to be oriented in the drawings, and are not intended to be limiting.

What is claimed is:

1. An apparatus comprising a device that includes:
   an electrical connector through which said device can receive electrical power from externally thereof, said electrical connector comprising an Edison-type base having a cylindrical recess therein;
   a radiation generator that, when energized, emits electromagnetic radiation, said radiation generator comprising at least one light emitting diode (LED);
   a power supply including a flexible carrier having circuitry that includes interconnected electrical circuit components on both sides thereof, said circuitry being operatively coupled between said connector and said radiation generator to convert household electrical power to an output signal suitable to drive the at least one LED, said flexible carrier circuitry being responsive to adapting electrical power received through said connector for energizing said radiation generator in a manner causing said at least one LED to produce radiation that is emitted from said device;
   wherein said flexible carrier is bent to form a ring-like cylindrical shape disposed in matching relationship within the cylindrical recess of the Edison-type base, and has opposite edge portions that are adjacent and coupled, wherein said flexible carrier electrically isolates said circuitry from said electrical connector.

2. An apparatus according to claim 1, wherein a piece of double-sided tape is disposed between said edge portions.

3. An apparatus according to claim 1, wherein said flexible carrier is a flexible circuit board.

4. An apparatus according to claim 1, wherein said device is a lightbulb.

5. An apparatus according to claim 1, wherein said electromagnetic radiation includes at least one of infrared radiation, ultraviolet radiation and visible radiation.

6. An apparatus according to claim 1, further comprising
   a potting material that has said carrier embedded therein and that is at least partly disposed within said recess, said potting material being thermally conductive to transfer heat from said carrier to said electrical connector.

7. An apparatus according to claim 6, wherein said electrical connector has first and second electrical contacts; and
   including first and second electrical conductors that are disposed within said potting material and that each have one end electrically coupled to said circuitry and another end electrically coupled to a respective one of said contacts.

8. An apparatus according to claim 7, wherein said potting material is electrically non-conductive.

9. An apparatus according to claim 1, including a member having said carrier embedded therein.

10. An apparatus according to claim 9, wherein said member is disposed at least partly within said recess.

11. An apparatus according to claim 10, wherein said recess has an internal thread; and wherein said member has an external thread that engages said internal thread in said recess.

12. An apparatus according to claim 11, wherein said member is made of an electrically non-conductive and a thermally conductive material;
   wherein said base has two electrically conductive parts within said recess, one of said parts having said internal thread thereon;
   wherein said circuitry includes a microprocessor for producing said output signal to drive said LED; and
   including two electrical conductors in said member that each have a first end electrically coupled to said circuitry on said carrier, and that each have a second end protruding from said member and engaging a respective one of said electrically conductive parts of said base.

13. An apparatus according to claim 11, wherein said device includes a part having a further recess with an internal thread; and
   wherein said member has a further external thread thereon that engages said internal thread in said further recess.

* * * * *